United States Patent [19]
Witchger

[11] Patent Number: 6,097,602
[45] Date of Patent: Aug. 1, 2000

[54] INTEGRATED CIRCUIT PACKAGE HEAT SINK ATTACHMENT

[75] Inventor: William J. Witchger, Indianapolis, Ind.

[73] Assignee: Marian, Inc., Indianapolis, Ind.

[21] Appl. No.: 09/102,790

[22] Filed: Jun. 23, 1998

[51] Int. Cl.[7] ........................................ H05K 7/20
[52] U.S. Cl. ................................................ 361/705
[58] Field of Search ............................... 62/259.2, 259.3; 165/104.17, 104.33, 185; 174/16.3; 257/706, 713; 361/699, 700, 702–705, 717, 718; 428/389, 403, 406, 421, 422

[56] References Cited

U.S. PATENT DOCUMENTS

| | | |
|---|---|---|
| 5,137,283 | 8/1992 | Giarrusso . |
| 5,430,609 | 7/1995 | Kikinis . |
| 5,455,458 | 10/1995 | Quon . |
| 5,545,473 | 8/1996 | Ameen . |
| 5,591,034 | 1/1997 | Ameen . |
| 5,945,217 | 8/1999 | Hanrahan . |

OTHER PUBLICATIONS

*Thermoset Quality Resin Formulators*, JLS–02–164, Apr. 20, 1998, 1 page.
*Tetko, Inc. Precision Woven Screening Media*, 1997, 2 pgs.
*Furon Thermal Management Solutions for Microprocessors*, 1996, Furon Company, New Haven, CT, 10 page catalog.
CPU PAD, Thermally Conductive, Electrically Insulating, Double Coated Tape, The Bergquist Company, Minneapolis, MN, 1996, 2–sided copy of literature.

*Primary Examiner*—Gerald Tolin
*Attorney, Agent, or Firm*—Woodard, Emhardt, Naughton, Moriarty & McNett

[57] ABSTRACT

An interface between an integrated circuit package and a heat sink comprises a sandwich of a temperature-induced, solid-to-liquid phase-changing, thermally-conductive material wafer impregnated in a liquid-permeable mounting mesh sheet sandwiched between two pressure-sensitive adhesive frames also impregnating the sheet surrounding the wafer location. The adhesive impregnated sheet frame prevents bleeding of the phase change material out of the space between the integrated circuit package and the heat sink. Methods of making the interface are described.

15 Claims, 2 Drawing Sheets

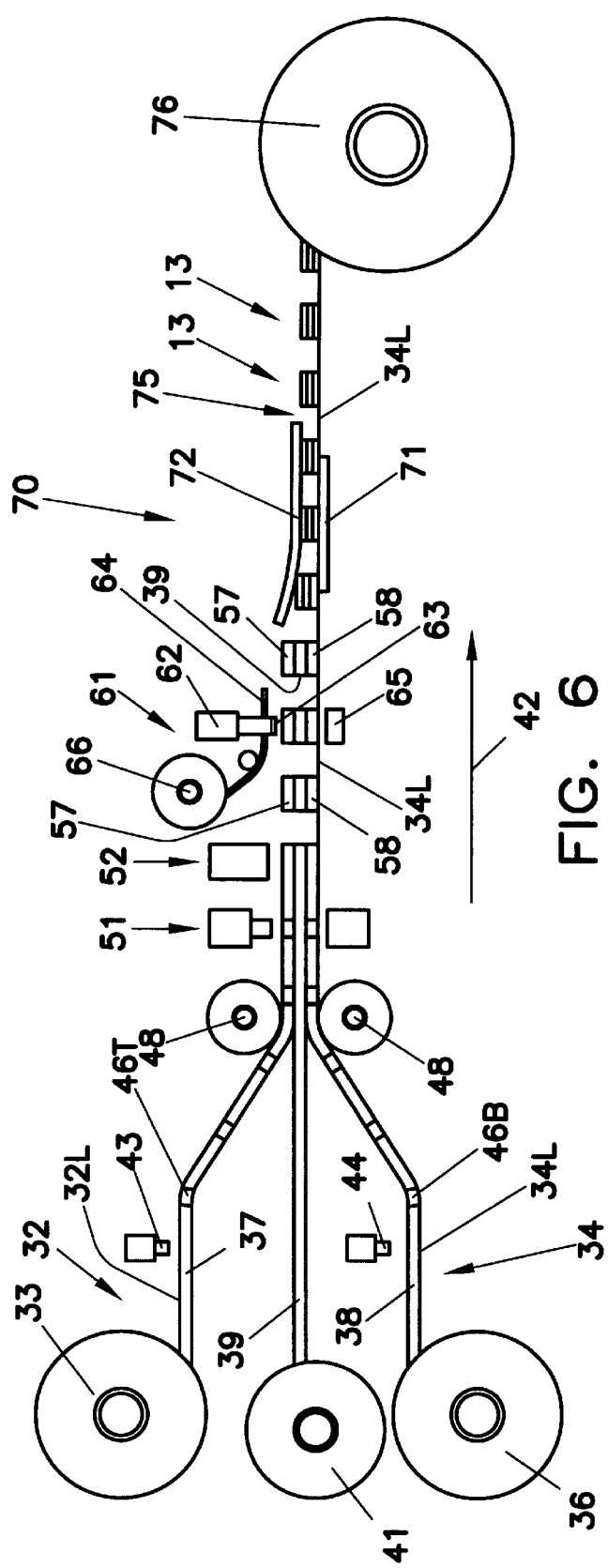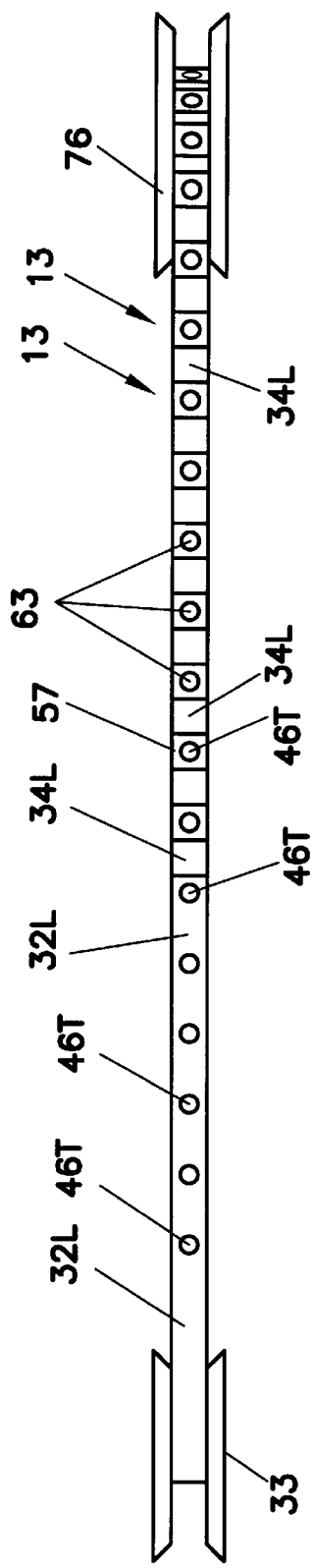

INTEGRATED CIRCUIT PACKAGE HEAT SINK ATTACHMENT

BACKGROUND OF THE INVENTION

This invention relates generally to integrated circuit (IC) packages, and more particularly to a device and method for attachment of a heat sink to such a package. Heat sinks made of thermally conductive metal are widely used with electrical circuit components. Even though small components do not generate much heat, they are not able to endure much heat. If they are integrated circuit devices, their performance may deteriorate at higher temperatures. Their useful life may be shortened too. Therefore, heat sinks are often used with integrated circuit packages. Spring clips have been used to attach the heat sink to the package. Usually there is some interface material between the package and the heat sink. While it may serve the purpose of electrical isolation, its primary purpose is to transfer the heat from the IC package to the heat sink. An optimum combination of dielectric strength and thermal conductivity is not always available. In any case it is desirable to have good conformance of the interface material with both the package and the heat sink to have good thermal transfer. To provide good conformance, adequate contact pressure is necessary. With some package, interface and heat sink materials, the contact pressure needed and obtainable by the spring clips is more than the package can withstand without damage. In such instances, adhesives have been used in lieu of clips to secure the heat sink to the package.

One conventional way to provide the interface between the IC package and the heat sink is to apply a thermally conductive grease or paste to the package substrate and to the heat sink. This requires some skill in neatly applying the grease or paste and in obtaining the desired uniformity of thickness. Another way of attachment according to a description by the Bergquist Company of Minneapolis, Minn., is to use a tape that consists of a high performance acrylic, pressure sensitive adhesive, on both sides of a Kapton MT film. The tape has a clear release liner material on one face and a white release liner material on the other face. To install it, the clear liner is removed from one face and the tape is rolled onto the IC package substrate. Then the white liner on the other face is removed and the heat sink is pressed lightly (less than 10 pounds per square inch) onto the substrate. While the skill level required for this procedure may be less than that for a good application of the paste interface method, a problem can develop during the use of the electronic equipment of which the IC package is a part. This is due to the fact that some films of the Kapton type change from a solid to a fluid phase as they become warm. While this phase change enhances the thermal conductivity, without changing electrical resistivity, it can result in a problem of seeping of the material and resultant leakage in the electronic equipment, particularly if the plane of the interface is vertically oriented.

SUMMARY OF THE INVENTION

Described briefly, according to a typical embodiment of the present invention, a sandwich is made comprising a temperature-induced, phase-changing, thermally-conductive material wafer impregnated into a liquid-permeable mounting sheet sandwiched between two adhesive carrier pieces which frame the wafer location. That is in registry with the circuit package location where the circuit chip is located. To apply the mounting sheet to the package, one of the carriers is pulled away from one face of the mounting sheet and the sheet is rolled onto the package substrate. The adhesive which was on the one carrier is now deposited on the sheet and adheres the sheet to the substrate. Then the other carrier is pulled away from the sheet. The adhesive which was on that carrier is now deposited on the sheet. Then the heat sink is pressed onto the sheet such that the heat sink is attached to the sheet by the adhesive which was deposited on the sheet by the other carrier as it was pulled away. The attachment of the sheet to the chip and to the heat sink by the adhesive is outboard of the area in which the heat is generated in the chip, and outboard of the phase change material. Therefore, when the chip warms up, the sheet material outboard of the phase change material forms a dike, preventing that material from oozing or running out.

The sandwich construction can be provided in sheet, die cut pieces or in roll form. For example of the latter, carriers are provided in continuous rolls and apertured at longitudinally spaced locations thereby providing windows to expose the phase change material to both the chip and the heat sink directly without adhesive between them at the windows. The mounting sheet is also provided in rolls. The phase change material wafers are applied to the mounting sheet at longitudinally spaced locations. The two adhesive carriers and the mounting sheet with phase change material on it are fed in synchronism from the rolls and delivered together to produce a continuous tape sandwich accumulated on rolls for delivery to the chip and substrate assembler.

It is an object of the present invention to provide an improved method of attaching a heat sink to an integrated circuit device. Other objects and advantages will become apparent as the description proceeds.

BRIEF DESCRIPTION OF THE DRAWINGS

FIG. 6 is a schematic view of a manufacturing procedure for making the interface material.

FIG. 7 is a top plan view thereof.

DESCRIPTION OF THE PREFERRED EMBODIMENT

Figure 1:
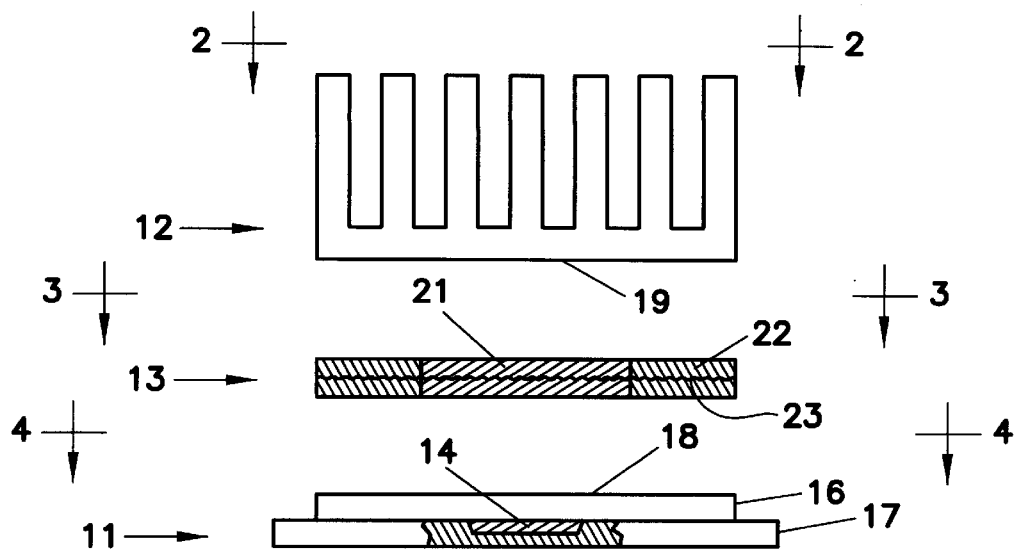
FIG. 1 is an exploded elevational view, partially in section, of an integrated circuit package and heat sink assembly.
Figure 2:
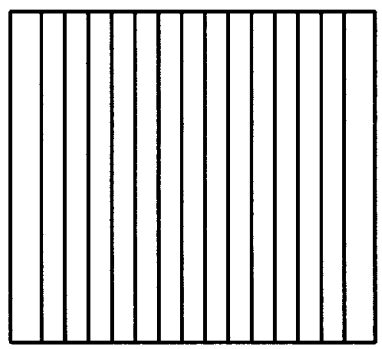
FIG. 2 is a top plan view thereof as at line 2—2 in FIG. 1 and viewed in the direction of the arrows.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to the drawings in detail, FIG. 1 is an exploded view of an integrated circuit package and heat sink assembly with the circuit package 11, the heat sink 12 and the thermal interface 13. The circuit package can be any of a variety of constructions and is shown with the chip or die 14, a heat transferring substrate 16 attached to the die, and lead frame 17. The face 18 of the substrate is to be thermally attached to the face 19 of the heat sink. For this purpose, a phase change material 21 is used. It is enclosed within a frame 22 of material which prevents the running or oozing of the material 21 from within the space between surfaces 18 and 19.

Figure 3:
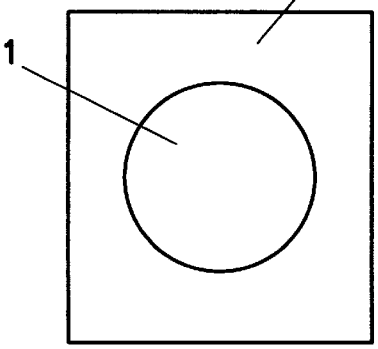
FIG. 3 is a section therethrough at line 3—3 in FIG. 1 and viewed in the direction of the arrows and showing the thermal interface.
Figure 4:
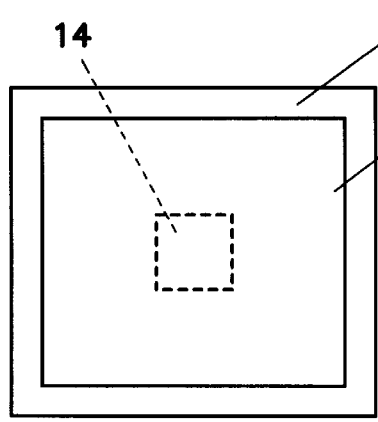
FIG. 4 is a plan view of the integrated circuit package taken at line 4—4 in FIG. 1 and viewed in the direction of the arrows.

Referring to FIG. 3, the thermal interface device 13 has an area as large as that of the heat sink face 19, being of essentially the same outside dimensions. It is also of essentially the same area as the substrate face 18 as shown in FIG. 4. The phase change material 21 is in the center, surrounded by the frame 22. When sandwiched between the faces 18 and 19, the thickness of the interface is between 0.005 and 0.020 inches. The frame 22 comprises a mesh 23 impregnated with pressure-sensitive adhesive whereby it is attached thoroughly to both the face 18 and the face 19. Since the phase change material has a high thermal conductivity, the heat generated in the package 11 and which likely is greatest at the central location of the integrated circuit chip 14, is effectively transferred from the IC package to the heat sink from which it is dissipated.

In addition to carrying the adhesive in a frame configuration, the mesh is impregnated with the phase change material inboard of the outer perimeter. Thus, the pressure-sensitive adhesive is everywhere between the perimeter of the phase change material and the outer perimeter of the mesh. An example of such a mesh material is a polyester mesh about 0.003 inches thick. The preferable porosity or open air space in the mesh is 50% to 70% of the area. An example of such material is catalog No. TET-3-125/45 made by TETKO Inc. of Depew, N.Y. 14043. An example of metal mesh in aluminum is No. 2AL5-4/OF by Exmet Corporation of 7 Great Hill Road, Naugatuck, Conn. An example of the phase change material is catalog No. 02-183 made by Thermoset of 5101 East 65$^{th}$ Street, Indianapolis, Ind. 46220. This material changes from a solid phase to a liquid phase, beginning to melt at 40° C. Other phase change materials may begin to change phase at other temperatures. At about 50° C., change from solid to liquid can be expected. The present invention may be used with any of them.

Broadly speaking, to make an interface device according to one embodiment of the present invention, a piece of mesh about the size of the IC package or heat sink to which it is to be attached, has a pressure-sensitive adhesive applied to both sides of it in a way to frame identical areas on both sides of the mesh, with pressure-sensitive adhesive. Then a wafer of the phase change material, which is about 0.001 inches thicker than the mesh, and slightly smaller than the adhesive frame, is placed on the central area of the mesh where there is no adhesive. Then the combination is placed between a couple of platens heated to about 150 degrees F. and mashed flat. This impregnates the area of the mesh immediately outside of the wafer and on both the upper and lower faces of the mesh, which has already had pressure sensitive adhesive applied to it and which, upon the mashing step, also bleeds through the mesh, thereby creating an island of the phase change material 21 with a dike or dam 22 entirely surrounding it. This interface device 13, with the pressure sensitive adhesive both on the top and bottom and framing the material 21, can be applied first to the substrate 18 with a very light pressure and thereby adhesively attached to surface 18. Following that, the heat sink can be placed on top of the interface 13 and lightly pressed downward to thereby adhesively attach it to the interface. Thereby a high quality, non-bleeding thermal interface is provided between the integrated circuit package and the heat sink.

A convenient way to apply the adhesive is to use pressure sensitive adhesive cast on tape. Two pieces of tape can be used. Each may have a carrier paper with the adhesive cast on it, and a release liner on the other face of the adhesive. Each tape has a hole punched in it. The punched out blanks with adhesive on them are removed and discarded. Then a piece of mesh is provided about the size and shape of the heat sink or IC package, as described above. Then, with the release liner removed from one face of each tape strip, one strip is applied to the top of the mesh. The other strip is applied to the bottom of the mesh. Then they are lightly squeezed together. This transfers the adhesive from both strips to the mesh. Then a wafer of the phase change material is placed in the hole in the top or bottom strip. The wafer is slightly smaller than the hole. If the hole is round, the diameter of the wafer is about 0.020 inches smaller than the hole and therefore is that much smaller than the clean area of the mesh in which it is to be impregnated. Then the combination is placed on a hot platen. A corresponding hot platen, also at about 150 degrees F., is lowered onto the top strip and the two are squeezed together to an overall height of between 0.005 and 0.020 inch thick, depending upon the desired thickness of the interface. When this is done, the phase change material bleeds through the mesh from the top to the bottom and the adhesive bleeds through the mesh from the liners in an area completely surrounding the phase change material. Then, the assembly can be removed from the platen and cooled and is ready for application to an IC package and heat sink. For that purpose, the lower liner is stripped away and the interface lightly pressed onto the package substrate 18. Then the upper liner is stripped away and the heat sink is pressed lightly on top. The maximum pressure is less than 10 lbs. per square inch during the application of the heat sink to the package.

The phase change material may be applied in block form, calendared and rolled into sheets approximately 9 mil. thick. The sheet material may be slit into whatever convenient width is desired, and punched with a hole of any shape desired to provide the wafer to install within the area surrounded by the adhesive that is transferred to the mesh when the two adhesive liners, absent the punched-out hole, are applied to the mesh.

FIGS. 6 and 7 show schematically, one possible arrangement for mass production of the interface according to the present invention. In this case, a first tape 32 is supplied from spool 33 and a second tape 34 is supplied from spool 36. Both of these tapes are of the same type and are made of an acrylic liner with a high quality pressure-sensitive adhesive such as 37 on tape liner 32L and adhesive 38 on tape liner 34L, cast on the liners. In the illustration, the liner 32L is at the top on tape 32 and the liner 34L is at the bottom on tape 34. A third strip which will be referred to as a carrier 39, is a fabric mesh supplied from roll 41. The process moves in the direction of arrow 42.

Figure 5:
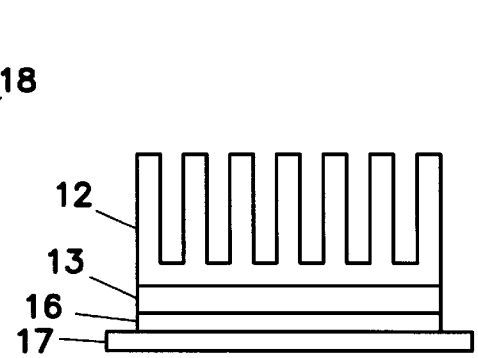
FIG. 5 is an elevational view of a completed assembly of an integrated circuit package, interface, and heat sink.

Punches 43 and 44 punch a hole in each of the tapes at spaced locations along its length. The hole is punched entirely through the tape liner and adhesive and is of the shape desired for surrounding the phase change material to be applied later in the process. In FIG. 7, there is an example of round holes 46T punched in the upper tape liner 32L. Then the two tapes are squeezed together on the carrier mesh 39 by a couple of rollers 48, for example. This securely applies the adhesive facing from the tape liners to both top and bottom of the mesh, and everywhere except where the holes are in the tapes and from which the adhesive, as well as the liner, was removed at the punching station. At the next station 51, a cut is made in the sandwich around the hole 46 and all the way down to the lower liner 34L, but not through it. This cut is made to remove everything from the top of the lower liner except for a frame of adhesive 57 around the hole 46 on top of the mesh, and a frame of adhesive 58 around the hole in the lower liner 34L. At station 52, the waste materials are stripped away so that all that is left then is the lower liner carrying discrete units combining the mesh 39 without any hole in it, and the two layers of adhesive 57 and 58 on the top and on the bottom of the mesh 39, with the lower frame of adhesive 58 remaining adhered to the lower liner 34L. Then, the phase change material is applied at station 61 by the use of a punch 62 which punches the wafer 63 from a strip or sheet 64 supplied from a spool 66, and places the punched wafer 63 in the hole at 46T within the frame of adhesive 57. Then, in a manner similar to that described above with respect to the single unit heating and squeezing, the interface is moved between a couple of heated platens 71 and 72 whereupon the sandwiched materials are squeezed together to produce interface devices 13 like that shown in FIGS. 1, 3 and 5. While the frame 22 in FIGS. 1, 3 and 5, is square on the outside and round on the inside, as is true of the frames 57 and 58 in FIGS. 6 and 7 which are squeezed together to impregnate the mesh as in FIGS. 1, 3 and 5, it should be understood that the shape can be whatever is desired. This is true, also, of the hole 46T and 46B and the wafer to be placed in the hole. It is preferable that the exterior configuration of the wafer be the same as the interior configuration of the hole in the frame. Also, to allow for lateral expansion of the wafer as it is heated and mashed in the sandwich at station 70, for example, it should be a little smaller (such as mentioned in one example above) so that it has room to expand laterally as it is forced through the mesh by the heated punch 62 and platen 65 at the punch and place station 61. The completed interface units remain on the liner 34L and are rolled up on the collecting spool 76.

Spools of interface devices according to the present invention, can be supplied to the assemblers of circuit boards and components and peeled off the liner 34L as they are applied to circuit package substrates, followed by application of the heat sink to the opposite exposed surface. Because the adhesives have blended through the mesh in a frame around the phase change material, and the phase change material has moved completely through the mesh and is thereby exposed on both sides, it makes excellent thermal contact with the IC package substrate and with the heat sink face 19, particularly after the phase change, but is prevented from moving outboard of the area defined by the hole in the adhesive, due to the combination of the adhesive completely occupying any space in the mesh 39 and thoroughly adhered to both the circuit package substrate and the heat sink face completely around the perimeter of the phase change material.

It should be understood that various brands of phase change material can be used. Also, although the mesh described is a plastic mesh, sometimes referred to as a non-woven polyester matte, other materials may also be used. Aluminum mesh is also an example, as described above. It is not necessary that the phase change material have any adhesive properties at all.

It may be desirable to provide a cooling station at 75 prior to rolling the liner 34L onto the reel 76. The specific liner used may be an acrylic or it may be another suitable carrier to which the pressure sensitive adhesive is securely mounted but from which it is readily transferred to the intermediate strip, mesh in the described examples, when desired to do so. Also, while the FIGS. 6 and 7 show one process for manufacturing the interface devices in quantities on a continuous basis, other techniques might also be used. Even with that shown in FIGS. 6 and 7, it may be desirable to employ the cutting and stripping steps downstream from the punch and place steps, rather than upstream as shown.

The present invention may be applied to a variety of circuit packages. A couple of examples are microprocessors and power transistors. There is no need for spring clip attachment of the heat sink to the IC package.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An electronic circuit component assembly comprising:
   an integrated circuit package having a substrate;
   a heat sink having a mounting surface;
   a thermal phase change heat transfer interface material between the substrate and the mounting surface and directly contacting the mounting surface and substantially the entire surface area of the substrate facing the heat sink mounting surface; and
   a dike around the phase change material and adhesively attached to the substrate entirely around the perimeter of the phase change heat transfer material and adhesively attached to the heat sink mounting surface and thereby holding the package and the heat sink together, and the dike being sealed to both the substrate and to the mounting surface along areas entirely surrounding the phase change material to prevent movement of the material from the space between the substrate and the mounting surface and thereby sealing the phase change material in said space after change of phase to liquid.

2. The assembly of claim 1 and wherein:
   the dike comprises an adhesive.

3. The assembly of claim 2 and wherein:
   the adhesive is pressure sensitive; and
   the dike comprises a fabric carrier with the adhesive thereon.

4. An integrated circuit and heat sink combination comprising:
   an integrated circuit device;
   a heat sink;
   a thermally conductive, phase change material deposit having top and bottom faces and a perimeter from the top face to the bottom face;
   confining material surrounding the perimeter of the deposit;
   the confining material including pressure-sensitive adhesive,
   the adhesive attaching the integrated circuit to the heat sink and preventing migration of the phase change material outboard beyond an inner marginal perimeter of the confining material upon a change of phase of the phase change material to liquid at a temperature above its phase change temperature.

5. The combination of claim 4 and wherein:
   the circuit device has a flat heat transmitting surface;
   the heat sink has a flat heat receiving surface;

the surfaces being in spaced parallel planes;

the phase change material being in a central portion of the space between the planes and touching both surfaces; and the confining material being outboard of the phase change material and contacting both surfaces in the space surrounding the phase change material and preventing migration of the phase change material out of the space between the surfaces.

6. A combination comprising:

an integrated circuit device having a heat transfer contact surface;

a heat sink having a heat transfer contact surface facing toward said heat transfer contact surface of said integrated circuit device;

an interface comprising a thermal phase change material contacting both surfaces and having a perimeter; and a dike contacting both surfaces and surrounding the phase change material interface perimeter, the dike being sealed to both surfaces around said perimeter and preventing seepage of said material.

7. The combination of 6 and wherein:

the phase change material phase change temperature is about 50° C.

8. The combination of claim 6 and wherein:

the dike includes pressure sensitive adhesive contacting both surfaces.

9. The combination of claim 8 and wherein:

the dike is a pressure sensitive adhesive attaching the integrated circuit device and heat sink together permanently.

10. The combination of claim 8 and wherein:

the dike is the one and only means attaching the integrated circuit device and heat sink together.

11. A heat sink system comprising:

an electronic component;

a heat sink;

a thermally conductive, phase change material deposit between the electronic component and the heat sink and in thermal communication with both; and an adhesive adhesively attached to the electronic component and to the heat sink and encircling the phase change material and preventing seepage of the phase change material when in the liquid phase.

12. The system of claim 11 and wherein:

the adhesive is disposed in the form of a frame around the deposit of phase change material.

13. The system of claim 11 and wherein:

the adhesive holds the electronic component and the heat sink firmly together and seals the deposit between the electronic component and the heat sink within the confines of the adhesive and thereby prevents the deposit material, when in the liquid state, from seeping out from between the electronic component and the heat sink.

14. The combination of claim 13 and wherein:

the adhesive is a deposit of an upper and a lower pressure-sensitive adhesive component in the form of a perimeter frame with an interior aperture in both adhesive components encircling the phase-change material deposit, the upper adhesive component adhering to the heat sink and the lower adhesive component adhering to the electronic component, and the upper and lower adhesive components adhering to each other.

15. The combination of claim 14 and further comprising:

a sheet of mesh;

the phase change material being impregnated in the mesh; and the adhesive being impregnated in the mesh outboard of the phase change material but contiguous with the electronic component and the heat sink around the perimeter of the deposit;

the adhesive preventing migration of the phase change material outboard beyond an inner marginal perimeter of the adhesive upon change of phase to liquid at a temperature above its phase change temperature.

* * * * *